(12) United States Patent
Chow et al.

(10) Patent No.: US 7,939,368 B2
(45) Date of Patent: May 10, 2011

(54) WAFER LEVEL CHIP SCALE PACKAGE SYSTEM WITH A THERMAL DISSIPATION STRUCTURE

(75) Inventors: Seng Guan Chow, Singapore (SG); Byung Tai Do, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 262 days.

(21) Appl. No.: 11/276,611

(22) Filed: Mar. 7, 2006

(65) Prior Publication Data
US 2007/0212812 A1    Sep. 13, 2007

(51) Int. Cl.
*H01L 21/00* (2006.01)

(52) U.S. Cl. ........ 438/106; 438/113; 438/118; 438/122; 257/707; 257/783; 257/E21.001

(58) Field of Classification Search ........... 257/E23.109, 257/707, E21.001; 438/113, 114, 106
See application file for complete search history.

(56) References Cited

U.S. PATENT DOCUMENTS

| | | | | |
|---|---|---|---|---|
| 5,533,256 A | * | 7/1996 | Call et al. | 29/840 |
| 5,851,845 A | * | 12/1998 | Wood et al. | 438/15 |
| 5,854,741 A | * | 12/1998 | Shim et al. | 361/813 |
| 6,046,498 A | * | 4/2000 | Yoshikawa | 257/706 |
| 6,432,497 B2 | * | 8/2002 | Bunyan | 428/40.1 |
| 6,667,548 B2 | * | 12/2003 | O'Connor et al. | 257/712 |
| 6,797,544 B2 | * | 9/2004 | Ozono et al. | 438/121 |
| 6,853,068 B1 | | 2/2005 | Djekic | |
| 6,916,688 B1 | * | 7/2005 | Kelkar et al. | 438/122 |
| 6,987,671 B2 | | 1/2006 | Houle | |
| 7,094,618 B2 | * | 8/2006 | Tandy et al. | 438/26 |
| 7,112,469 B2 | * | 9/2006 | Mihara | 438/110 |
| 7,169,685 B2 | * | 1/2007 | Connell et al. | 438/460 |
| 7,387,911 B2 | * | 6/2008 | Audette et al. | 438/114 |
| 7,435,664 B2 | * | 10/2008 | Lu et al. | 438/460 |
| 2001/0016369 A1 | * | 8/2001 | Zandman et al. | 438/106 |
| 2002/0173077 A1 | * | 11/2002 | Ho et al. | 438/113 |
| 2004/0113283 A1 | * | 6/2004 | Farnworth et al. | 257/782 |
| 2005/0136640 A1 | | 6/2005 | Hu et al. | |
| 2005/0287766 A1 | * | 12/2005 | Chrysler et al. | 438/459 |

OTHER PUBLICATIONS

"McGraw-Hill Dictionary of Scientific and Technical Terms, Sixth Edition", 2003, p. 526, Publisher: McGraw-Hill, Published in: New York.

* cited by examiner

*Primary Examiner* — Angel Roman
(74) *Attorney, Agent, or Firm* — Mikio Ishimaru

(57) ABSTRACT

A wafer level chip scale package system is provided forming a wafer having an interconnect provided on an active side, forming a thermal sheet having a first thermal interface material layer and a thermal conductive layer, and attaching the thermal sheet on a non-active side of the wafer.

19 Claims, 4 Drawing Sheets

WAFER LEVEL CHIP SCALE PACKAGE SYSTEM WITH A THERMAL DISSIPATION STRUCTURE

TECHNICAL FIELD

The present invention relates generally to wafer level chip scale package and more particularly to wafer level chip scale package having a thermal dissipation structure.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Contemporary electronics expose integrated circuits and packages to more demanding and sometimes new environmental conditions, such as cold, heat, and humidity. As more functions are packed into the integrated circuits and more integrated circuits into the package, more heat is generated degrading the performance, the reliability, and the lifetime of the integrated circuits.

Every new generation of integrated circuits with increased operating frequency, performance and the higher level of large scale integration have underscored the need for robust thermal management structures with integrated circuit packages. It is well acknowledged that when a semiconductor device becomes denser in term of electrical power consumption per unit volume, heat generated is also increases correspondingly. As the state of the art progresses, the ability to adequately dissipate heat is often a constraint on the rising complexity of package architecture design, smaller footprint, higher device operating speed and power consumption. Numerous technologies have been developed to meet these requirements. Some of the research and development strategies focus on new thermal package technologies while others focus on improving the existing package technologies. Yet others focus on wafer level chip scale packaging to minimize packaging process complexity and package dimensions.

Wafer level chip scale package (WLCSP), unlike any conventional packages, is a bumped die that can be directly mounted on a printed circuit board (PCB) without requiring further packaging. This package type offers a cheaper alternative compared to conventional chip scale package (CSP). Typical WLCSP does not have any thermal conductive medium on its back surface providing the only possible way to conduct the heat generated from the package itself is through the solder bumps on the active side of the WLCSP. This limits the use of such packages to slow speed, low powered applications. Other approaches attach thermally conductive materials to the back surface of the wafer but require additional processing steps of the wafer before thermal attachment, increase cost, and present control difficulty.

Thus, a need still remains for a stackable integrated circuit package system providing low cost manufacturing, improved yields, reduction of the integrated circuit package dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a wafer level chip scale package system including forming a wafer having an interconnect provided on an active side, forming a thermal sheet having a first thermal interface material layer and a thermal conductive layer, and attaching the thermal sheet on a non-active side of the wafer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Figure 1:
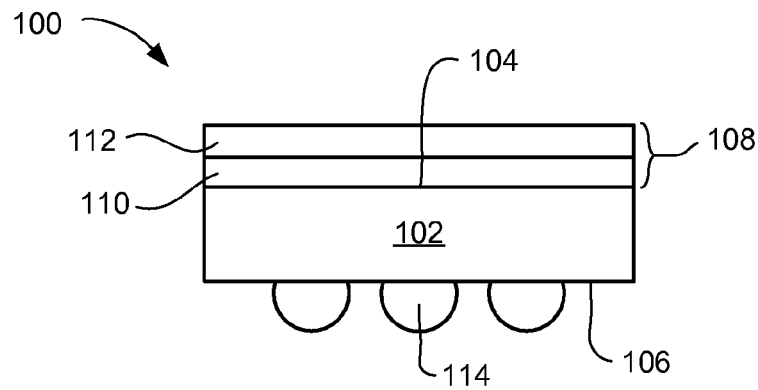
FIG. 1 is a cross-sectional view of a first wafer level chip scale package system in an embodiment of the present invention.

Referring now to FIG. 1, therein is shown a cross-sectional view of a first wafer level chip scale package system 100 in an embodiment of the present invention. The first wafer level chip scale package system 100 includes an integrated circuit die 102 having a non-active side 104 and an active side 106. A thermal sheet 108 attaches to the non-active side 104. The thermal sheet 108 may include a number of layers, such as a thermal interface material layer 110, such as a thermally conductive material, and a thermal conductive layer 112, such as a conductive foil. The active side 106 has circuitry (not shown) and interconnects 114, such as solder balls, provided thereon for connections to the next system level (not shown), such as a printed circuit board.

For illustrative purpose, the thermal sheet 108 is described as having two layers, although it is understood that the thermal sheet 108 may be composed of a different number of layers. Also for illustrative purpose, the thermal interface material layer 110 and the thermal conductive layer 112 are depicted as a single layer, although it is understood that the thermal interface material layer 110 and the thermal conductive layer 112 may not be a single layer.

The operation of the integrated circuit die 102 generates heat. This heat is dissipated by a number of paths including thermal flow from the circuitry on the active side 106 through the interconnects 114 to the next system level. The next system level may or may not serve as a large thermal sink or spreader. The interconnects 114 do not contact the entire surface of the active side 106 limiting the amount of thermal flow through the interconnects 114.

The non-active side 104 through the thermal sheet 108 provides an alternative thermal flow removing heat from the circuitry on the active side 106. The thermal sheet 108 contacts substantially the entire surface of the non-active side 104 providing maximum surface area for thermal transfer. The thermal interface material layer 110 attaches to the non-active side 104. The thermal conductive layer 112 provides the high thermal conductivity to dissipate the heat to ambient.

Figure 2:
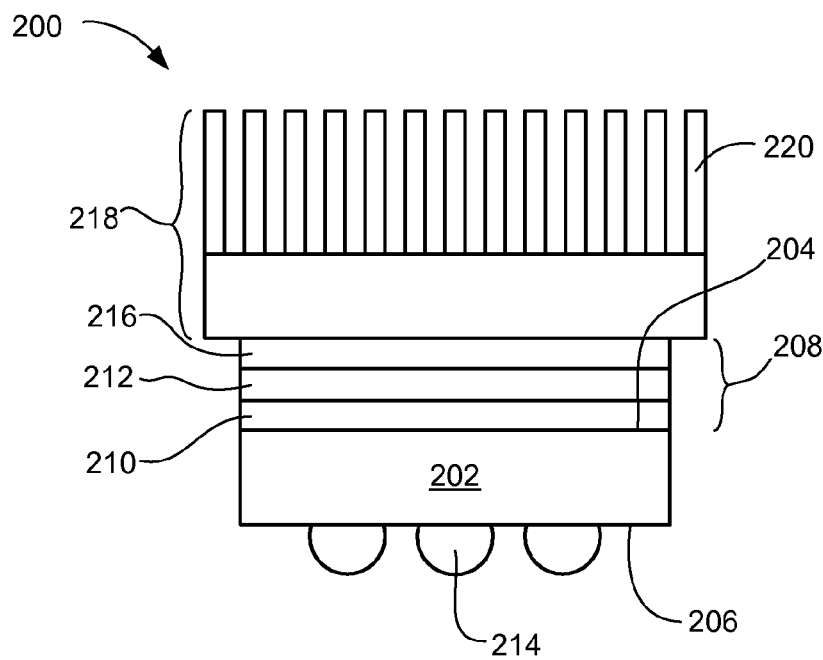
FIG. 2 is a cross-sectional view of a second wafer level chip scale package system in an alternative embodiment of the present invention.

Referring now to FIG. 2, therein is shown a cross-sectional view of a second wafer level chip scale package system 200 in an alternative embodiment of the present invention. The second wafer level chip scale package system 200 includes an integrated circuit die 202 having a non-active side 204 and an active side 206. A thermal sheet 208 attaches to the non-active side 204. The thermal sheet 208 may include a number of layers, such as a first thermal interface material layer 210, such as a thermally conductive material, a thermal conductive layer 212, such as a conductive foil and a second thermal interface material layer 216. A heat sink 218 attaches to the second thermal interface material layer 216. The active side 206 has circuitry (not shown) and interconnects 214, such as solder balls, provided thereon for connections to the next system level (not shown), such as a printed circuit board.

For illustrative purpose, the thermal sheet 208 is described as having three layers, although it is understood that the thermal sheet 208 may be composed of a different number of layers. Also for illustrative purpose, the first thermal interface material layer 210, the thermal conductive layer 212, and the second thermal interface material layer 216 are depicted as a single layer, although it is understood that the first thermal interface material layer 210, the thermal conductive layer 212, and the second thermal interface material layer 216 may not be a single layer.

The operation of the integrated circuit die 202 generates heat. This heat is dissipated by a number of paths including thermal flow from the circuitry on the active side 206 through the interconnects 214 to the next system level. The next system level may or may not serve as a large thermal sink or spreader. The interconnects 214 do not contact the entire surface of the active side 206 limiting the amount of thermal flow through the interconnects 214.

The non-active side 204 through the thermal sheet 208 provides an alternative thermal flow removing heat from the circuitry on the active side 206. The thermal sheet 208 contacts substantially the entire surface of the non-active side 204 providing maximum surface area for thermal transfer. The first thermal interface material layer 210 attaches to the non-active side 204. The thermal conductive layer 212 provides the high thermal conductivity to transfer the heat to the second thermal interface material layer 216. The heat sink 218 attaches to the second thermal interface material layer 216 and provides additional surface area with fins 220 to dissipate the heat.

Figure 3:
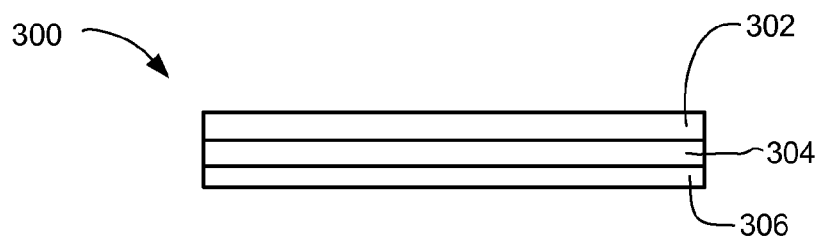
FIG. 3 is a cross-sectional view of a thermal sheet in an embodiment of the present invention.

Referring now to FIG. 3, therein is shown a cross-sectional view of a thermal sheet 300 in an embodiment of the present invention. The thermal sheet 300 may represent the thermal sheet 108 of FIG. 1 and the thermal sheet 208 of FIG. 2. The thermal sheet 300 includes a thermal conductive layer 302, a thermal interface material layer 304, and an optional layer of a release layer 306. The optional layer of the release layer 306 provides protection to the thermal sheet 300 prior to lamination onto the integrated circuit, such as the integrated circuit die 102 of FIG. 1.

The thermal sheet 300 may be provided in a precut or non-precut form. A coating consisting of the thermal interface material layer 304 is pre-applied to the thermal conductive layer 302. The thermal interface material layer 304 is a thermally conductive material, such as a B-stageable material or a polymeric-based material with conductive fillers, that may be attached to the integrated circuit die 102 of FIG. 1 by a number of methods, such as direct press, heat cure, or ultraviolet (UV) light cure. The preferred thickness of the thermal interface material layer 304 is less than 50 µm.

The thermal conductive layer 302 is also a thermally conductive material or foil including elements or alloys, such as copper (Cu), gold (Au), silver (Ag), aluminum (Al), nickel (Ni), or an alloy of more than one element. The preferred thickness of the thermal conductive layer 302 is less than 100 m. The thermal sheet 300, particularly the thermal conductive layer 302, allows for marking, such as ink or laser marking, of various colors are possible on the surface of the thermal conductive layer 302.

Figure 4:
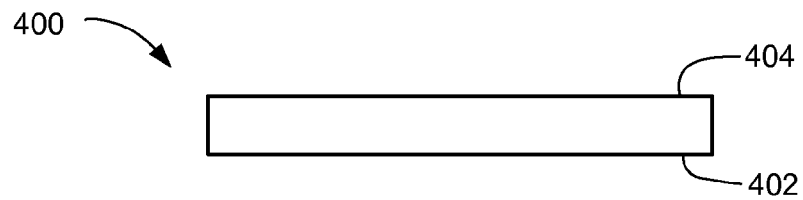
FIG. 4 is a cross-sectional view of a wafer in a circuitry fabrication phase in an embodiment of the present invention.

Referring now to FIG. 4, therein is shown a cross-sectional view of a wafer 400 in a circuitry fabrication phase in an embodiment of the present invention. The wafer 400 includes a non-active side 402 and an active side 404. Circuitry is fabricated on the active side 404. The wafer 400 is at a predetermined thickness.

Figure 5:
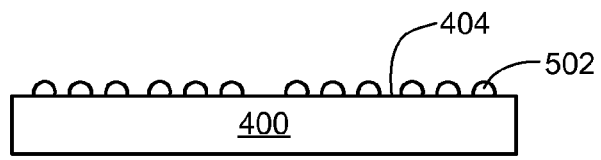
FIG. 5 is the structure of FIG. 4 in an interconnect-attach phase.

Referring now to FIG. 5, therein is shown the structure of FIG. 4 in an interconnect-attach phase. Interconnects 502, such as solder balls or solder bumps, as formed on the active side 404 of the wafer 400 at predetermined locations. The interconnect-attach phase may involve a post-passivation process.

Figure 6:
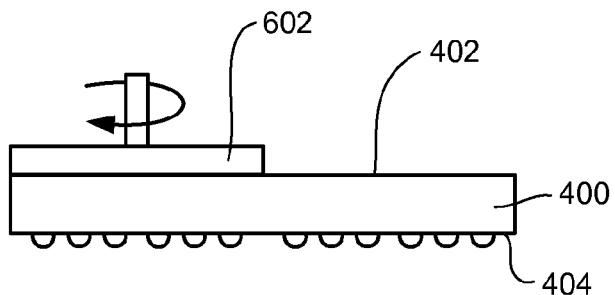
FIG. 6 is the structure of FIG. 5 in a thinning phase.

Referring now to FIG. 6, therein is shown the structure of FIG. 5 in a thinning phase. A thinning wheel 602 thins the non-active side 402 of the wafer 400. The thinning process does not damage circuitry on the active side 404 or the wafer 400.

Figure 7:
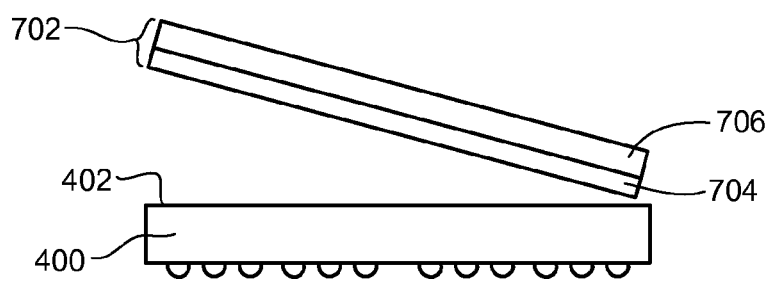
FIG. 7 is the structure of FIG. 6 in a sheet-attach phase.

Referring now to FIG. 7, therein is shown the structure of FIG. 6 in a sheet-attach phase. A thermal sheet 702 is laminated onto the non-active side 402 of the wafer 400, thinned. The lamination may be carried out by a number of processes, such as roller-press or direct-pressing. The thermal sheet 702 includes a thermal interface material layer 704 and a thermal conductive layer 706. The thermal interface material layer 704 attaches to the non-active side 402.

Figure 8:
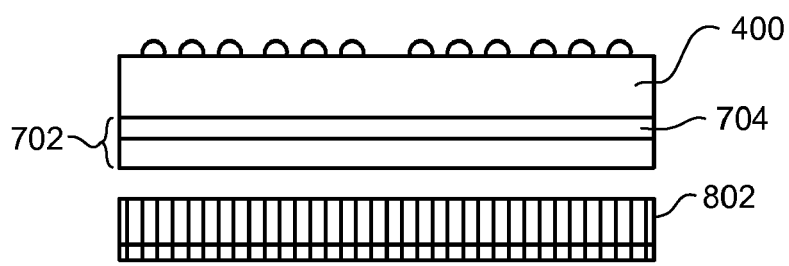
FIG. 8 is the structure of FIG. 7 in an optional cure phase.

Referring now to FIG. 8, therein is shown the structure of FIG. 7 in an optional cure phase. The thermal interface material layer 704 may be made by a number of materials, such as a B-stageable material or a polymeric-based material with conductive fillers. Depending on the material used, the thermal sheet 702 may be cured onto the wafer 400 with a source 802, such as a heat or ultraviolet light source. This phase is optional.

Figure 9:
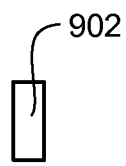
FIG. 9 is the structure of FIG. 8 in a marking phase.
Figure 9:

Referring now to FIG. 9, therein is shown the structure of FIG. 8 in a marking phase. A marking device 902, as a laser, is part of a wafer marking system, such as a wafer laser marking system, places identification on the thermal conductive layer 706 of the thermal sheet 702. The marking device 902 may incinerate the surface or to a predetermined depth of the thermal conductive layer 706. The marking device 902 may only cause pigmentation change on the surface of the thermal conductive layer 706. The marking process does not damage the wafer 400.

Figure 10:
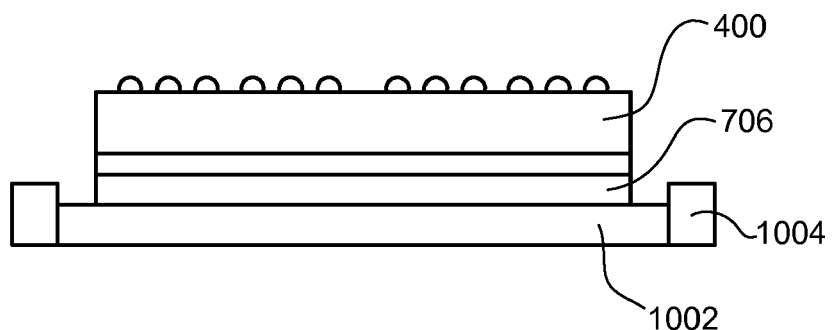
FIG. 10 is the structure of FIG. 9 in a tape-mount phase.

Referring now to FIG. 10, therein is shown the structure of FIG. 9 in a tape-mount phase. The structure of FIG. 9 having the wafer 400 is placed on a dicing tape 1002 secured by a wafer mount 1004. The thermal conductive layer 706 is on the dicing tape 1002.

Figure 11:
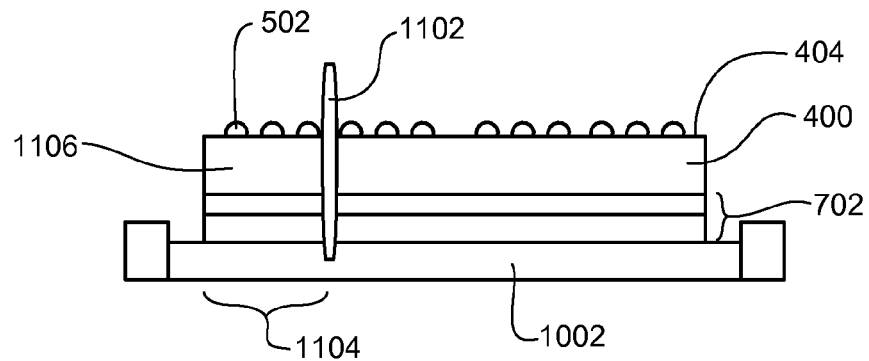
FIG. 11 is the structure of FIG. 10 in a singulation phase.

Referring now to FIG. 11, therein is shown the structure of FIG. 10 in a singulation phase. A saw 1102 singulates the structure of FIG. 10 having the wafer 400 forming a plurality of a wafer level chip scale package system 1104 having an integrated circuit die 1106 with the thermal sheet 702 attached and the interconnects 502 on the active side 404. The saw does not cut through the dicing tape 1002. The wafer level chip scale package system 1104 may represent the first wafer level chip scale package system 100 of FIG. 1 or part of the second wafer level chip scale package system 200 of FIG. 2.

Figure 12:
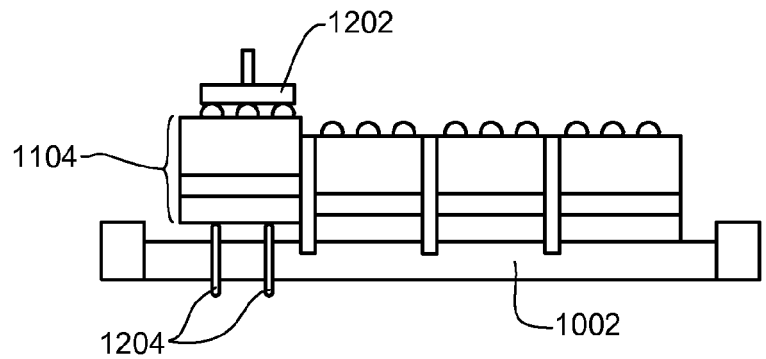
FIG. 12 is the structure of FIG. 11 in a pick-place phase.

Referring now to FIG. 12, therein is shown the structure of FIG. 11 in a pick-place phase. A pick-tool 1202 holds the wafer level chip scale package system 1104 as ejector pins 1204 pushes the wafer level chip scale package system 1104 off the dicing tape 1002. Other instances of the wafer level chip scale package system 1104 remains on the dicing tape 1002.

Figure 13:
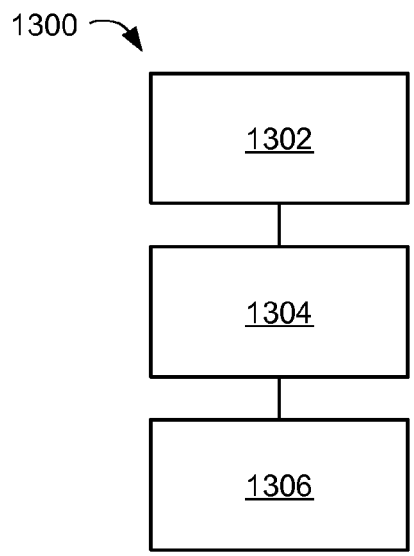
FIG. 13 is a flow chart of a wafer level chip scale package system for manufacture of the wafer level chip scale package system in an embodiment of the present invention.

Referring now to FIG. 13, therein is shown a flow chart of a wafer level chip scale package system 1300 for manufacture of the wafer level chip scale package system 100 in an embodiment of the present invention. The system 1300 includes forming a wafer having an interconnect provided on an active side in a block 1302; forming a thermal sheet having a first thermal interface material layer and a thermal conductive layer in a block 1304; and attaching the thermal sheet on a non-active side of the wafer in a block 1306.

It has been discovered that the present invention thus has numerous aspects.

It has been discovered that the present invention provides a flexible and scalable thermal management structure for wafer level chip scale packaging while providing better process control, eliminating separate adhesive layer application on the wafer or integrated circuit die, lowering cost, and providing maximum surface contact for optimal thermal dissipation.

An aspect is that the present invention is that the thermal sheet may be applied onto the wafer after the thinning process without adhesive application on the wafer. The thermal interface material layer of the thermal sheet may be applied on the wafer by a number of processes, such as roller-press or direct-press. Depending on the composition of the thermal interface material layer, the thermal sheet on the wafer may under heat or UV cure to further attach the thermal sheet to the wafer.

Another aspect of the present invention is that the thickness of the various layers of the thermal sheet, the number of layers, or the composition of the layers may be varied to suite the thermal requirements of the integrated circuit and environmental specifications. Additional thermal structures, such as heat sink with fins, may be attached to the thermal sheet scaling the thermal dissipation performance by providing additional surface area to ambient.

Yet another aspect of the present invention is that the pre-application of the thermal interface material layer on the thermal conductive layer avoids the need for a separate application of thermal adhesive onto the wafer. This eliminates waste of material as well as a separate step.

Yet another aspect of the present invention is that the thermal sheet also provides protection during dicing to prevent chipping on the wafer. The thermal sheet also protects the wafer from the ejector pins during the pick and place process.

Yet another important aspect of the present invention is that it valuably supports and services the historical trend of reducing costs and increasing performance. These and other valuable aspects of the present invention consequently further the state of the technology to at least the next level.

Thus, it has been discovered that the wafer level chip scale package system method of the present invention furnishes important and heretofore unknown and unavailable solutions, capabilities, and functional aspects for increasing chip density while minimizing the space required in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacturing a wafer level chip scale package system comprising:
    forming a wafer having a non-active side and an active side;
    forming an interconnect on the active side;
    forming a thermal conductive layer;
    forming a first thermal interface material layer pre-applied on the thermal conductive layer to form a thermal sheet;
    attaching the thermal sheet on the non-active side of the wafer; and
    curing the thermal sheet onto the non-active side of the wafer.

2. The method as claimed in claim 1 wherein attaching the thermal sheet on the non-active side of the wafer includes attaching the first thermal interface material layer on the non-active side.

3. The method as claimed in claim 1 further comprising attaching a heat sink on a second thermal interface material layer on the thermal sheet, wherein the second thermal interface material layer is attached on the thermal conductive layer.

4. The method as claimed in claim 1 wherein forming the wafer having the interconnect provided on the active side includes thinning the non-active side.

5. The method as claimed in claim 1 forming the thermal sheet includes attaching a release layer to the first thermal interface material layer.

6. A method of manufacturing a wafer level chip scale package system comprising:
   forming a wafer having circuitry and an interconnect provided on an active side;
   forming a thermal sheet having a thermal interface material layer pre-applied on a thermal conductive layer;
   laminating the thermal sheet on the wafer with the thermal interface material layer on a non-active side of the wafer, and
   curing the thermal sheet onto the non-active side of the wafer.

7. The method as claimed in claim 6 further comprising protecting the non-active side with the thermal sheet during singulation.

8. The method as claimed in claim 6 wherein further comprising marking the thermal sheet on the wafer.

9. The method as claimed in claim 6 further comprising forming the wafer level chip scale package system from singulation of the wafer having the thermal sheet thereon.

10. A wafer level chip scale package system comprising:
    an integrated circuit die having a non-active side and an interconnect provided on an active side; and
    a thermal sheet having a thermal interface material layer pre-applied to a thermal conductive layer, the thermal sheet cured on the non-active side of the integrated circuit die.

11. The system as claimed in claim 10 wherein the thermal sheet on the non-active side of the integrated circuit die has the first thermal interface material layer on the non-active side.

12. The system as claimed in claim 10 further comprising a heat sink on the thermal sheet on the thermal conductive layer.

13. The system as claimed in claim 10 wherein the integrated circuit die having the interconnect provided on the active side is thinned on the non-active side.

14. The system as claimed in claim 10 further comprising the thermal sheet marked on the integrated circuit die.

15. The system as claimed in claim 10 wherein:
    the integrated circuit die having an interconnect provided on the active side has circuitry;
    the thermal sheet has the first thermal interface material layer having a thickness of less than or equal to about 50 microns pre-applied on the thermal conductive layer having a thickness of less than or equal to about 100 microns; and
    the thermal sheet on the non-active side of the integrated circuit die has the thermal interface material layer on the non-active side.

16. The system as claimed in claim 15 wherein the thermal sheet on the non-active side protects the non-active side.

17. The system as claimed in claim 15 wherein the first thermal interface material layer includes a thermally conductive material.

18. The system as claimed in claim 15 wherein the thermal conductive layer is a foil.

19. The system as claimed in claim 15 wherein the thermal conductive layer includes a material of copper, gold, silver, aluminum, nickel, or an alloy.

* * * * *

UNITED STATES PATENT AND TRADEMARK OFFICE
CERTIFICATE OF CORRECTION

| | | |
|---|---|---|
| PATENT NO. | : 7,939,368 B2 | Page 1 of 1 |
| APPLICATION NO. | : 11/276611 | |
| DATED | : May 10, 2011 | |
| INVENTOR(S) | : Chow et al. | |

It is certified that error appears in the above-identified patent and that said Letters Patent is hereby corrected as shown below:

<u>Column 4</u> lines 40-41, delete "100 m." and insert therefor --100μm.--

Signed and Sealed this

Thirteenth Day of September, 2011

David J. Kappos
*Director of the United States Patent and Trademark Office*